United States Patent [19]
Volk, Jr.

[11] Patent Number: 5,179,339
[45] Date of Patent: Jan. 12, 1993

[54] HOLIDAY LIGHT BULB TESTER WITH LIGHT BULB SOCKET INSERTABLE PROBES

[76] Inventor: Robert C. Volk, Jr., 298 Euclid Ave., Oakland, Calif. 94610

[21] Appl. No.: 745,729

[22] Filed: Aug. 16, 1991

[51] Int. Cl.⁵ .................................................. G01R 31/00
[52] U.S. Cl. .................................... 324/414; 324/403; 324/556; 340/642
[58] Field of Search ............... 324/403, 414, 506, 537, 324/556, 426, 555, 149, 72.5, 133; 340/641, 642

[56] References Cited

U.S. PATENT DOCUMENTS

| | | | |
|---|---|---|---|
| 3,281,671 | 10/1966 | Hughson | 324/403 |
| 4,259,635 | 3/1981 | Triplett | 324/556 X |
| 4,625,174 | 11/1986 | Eberhart | 324/426 |
| 5,008,626 | 4/1991 | Boyd, Sr. | 324/414 |

Primary Examiner—Gerard R. Strecker
Assistant Examiner—Diep Do
Attorney, Agent, or Firm—Douglas E. White

[57] ABSTRACT

A light bulb tester includes a body having first and second opposite ends. A pair of parallel cylindrical electrically-conductive wire probes on the first end are spaced apart a distance of from about 4.5 mm to about 6.0 mm, said distance including the widths of the two probes and the length of the gap formed between them. A pair of male and female nine-volt battery contacts are attached on the second end of the body so that the tester may be powered by a standard battery of the 9V (household transistor) size. The tester is used for testing a bulb of a holiday light bulb string of the standard type having a plurality of bulbs in sockets wired in series. The bottom of each socket forms an aligned pair of apertures or a slot leading to a pair of electrical socket contacts inside the socket. There is enough room in the apertures (or slot) to insert the probes and to connect them to the socket contacts in order to test the bulb while it remains in the socket.

15 Claims, 1 Drawing Sheet

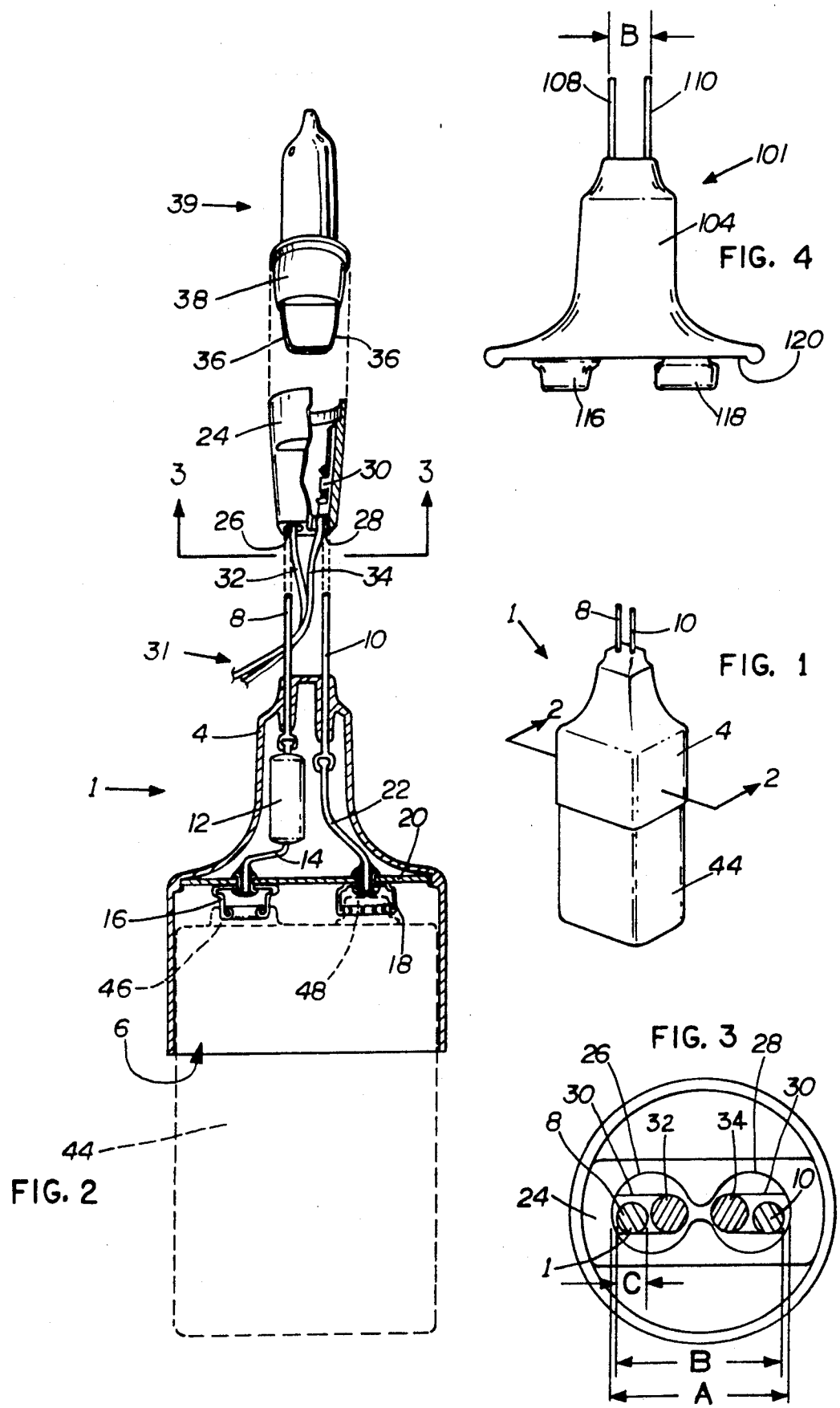

HOLIDAY LIGHT BULB TESTER WITH LIGHT BULB SOCKET INSERTABLE PROBES

FIELD OF THE INVENTION

This invention relates to circuit testers, more particularly to a tester for detecting defective bulbs in holiday light strings.

BACKGROUND OF THE INVENTION

Strings of decorative lights are used for adornment of Christmas trees and for other holiday functions. Certain types of light strings are wired in series. Therefore, when one bulb burns out, the entire string of lights goes out. It is then a matter of considerable effort and aggravation to determine which light bulb out of many is bad. Presently, one must unplug the string, remove each bulb, one at a time, and either test it or replace it with a bulb known to be good. After each replacement, the entire string must be plugged in again to see if the problem has been corrected. The light strings are mass produced out of the least expensive materials possible, so the very act of removing even a good bulb may damage it or its socket.

Prior developments in this field may be generally illustrated by reference to the following patents:

| U.S. Pat. No. | Patentee | Issue Date |
| --- | --- | --- |
| 3,725,780 | R. Olin | Apr. 03, 1973 |
| 4,943,752 | P. Todd et al. | Jul. 24, 1990 |
| 2,501,548 | A. Street | Mar. 21, 1950 |
| 2,155,778 | E. Stratton | Apr. 25, 1939 |
| 3,760,266 | G. Ocasio | Sep. 18, 1973 |
| 2,746,011 | P. Carson | May 15, 1952 |
| 2,756,384 | J. Meyer | Jul. 24, 1956 |
| 4,617,519 | E. Rosenthal | Oct. 14, 1986 |
| 1,411,430 | J. Graves | Apr. 04, 1922 |

U.S. Pat. No. 3,725,780 teaches a portable battery-powered holiday light bulb tester designed to handle two-pronged miniature bulbs.

U.S. Pat. No. 4,943,752 teaches a portable holiday light tester powered by a piezoelectric crystal.

U.S. Pat. Nos. 2,501,548 and 2,155,778 show battery-powered light bulb testers.

U.S. Pat. Nos. 3,760,266 and 2,746,011 teach holiday light testers that plug into the house circuit.

The rest of the patents are representative of what is in the art.

None of the patents show the use of precisely-spaced double prongs which fit into the bottom wire-exit apertures of standard holiday light sockets.

SUMMARY OF THE INVENTION

The present invention is a light bulb tester configured specifically for quickly finding the defective bulb (or bulbs) in a non-functioning holiday light string. On one end of the body of the tester are male and female contacts which fit any standard 9 volt small appliance (size "9 V") battery. The other end of the tester body has two parallel electrical probes which are spaced apart at the standard combined length of the two aligned wire exit apertures (or the length of a single exit slot) that are found in the back of light string bulb socket assemblies.

These two apertures are used by the electrical wires which lead to the contacts on the inside of the socket. There is, however, enough excess clearance in these apertures for the probes also to enter, so as to be able to touch the contacts of the socket and/or the light bulb. They thereby establish electrical connection with the contacts and bulb. Therefore, insertion of the probes (when a battery is connected to the tester) will cause a good bulb to light up in its socket even when another bulb in the string is bad, and even when the string is unplugged. No bulbs need to be removed until the defective one is found. The string needs to be unplugged and re-plugged only once. When a bulb does not light up in its socket with the tester, it can be removed and its condition double-checked by placing its contacts (now exposed) directly against the probes.

Available light strings typically operate at 3.5 volts. Therefore, a resistor may be included in the tester to reduce the voltage between the battery and the probes. Preferably, a 22 to 30 ohm, ½ watt resistor is used. Although the tester will work with less resistance, or none at all, an increased load on the bulb will result, potentially shortening bulb life.

FEATURES AND ADVANTAGES

An object of this invention is to provide a light tester for testing a holiday light bulb of one standard type, namely, one having a socket, the bottom of which socket forms an aligned pair of apertures or a slot. The apertures together, or the slot, have a first length. The tester includes a body and includes a pair of linear, electrically-conductive, probes affixed to the body and spaced apart a second length, which second length includes the width of each probe. The second length is equal to or less than the first length, but preferably not more than 1.5 mm less. The tester also includes means on the body for operatively connecting a battery to the probes for supplying electrical current thereto.

A further object is to provide such a tester wherein the connecting means includes a male battery contact and a female battery contact for attaching to the female and male posts, respectively, of a size 9 V nine-volt battery.

A further object is to disclose such a tester wherein the second length is from 4.5 mm to 6.0 mm and wherein each probe has a width of between 0.5 mm and 1.5 mm.

Yet another object or feature of this invention is to provide a method of testing a bulb of a holiday light bulb string of one standard type having a plurality of bulbs in sockets. The bottom of each socket forms an aligned pair of overlapping apertures (or a slot) leading to a pair of electrical socket contacts inside the socket. The method includes, as a first step, providing a light tester apparatus having a body, a pair of spaced-apart linear probes affixed to the body, and means on the body for operatively connecting a battery to the probes for supplying electrical current thereto. The second step is operatively connecting a battery to the connecting means. The third step is inserting the probes into the pair of apertures or slot so as to form an electrical circuit between the battery and the socket contacts, whereby an operative light bulb engaged in electrical connection with the socket contacts will light and whereby an inoperative light bulb engaged in electrical connection with the socket contacts will not light.

Another feature is an apparatus which is easy to use, attractive in appearance and suitable for mass production at relatively low cost.

Other novel features which are characteristic of the invention, as to organization and method of operation, together with further objects and advantages thereof will be better understood from the following description considered in connection with the accompanying drawing in which a preferred embodiment of the invention is illustrated by way of example. It is to be expressly understood, however, that the drawing is for the purpose of illustration and description only and is not intended as a definition of the limits of the invention.

Certain terminology and derivations thereof may be used in the following description for convenience in reference only and will not be limiting. For example, the words "upwardly," "downwardly," "leftwardly," and "rightwardly" will refer to directions in the drawings to which reference is made. The words "inwardly" and "outwardly" will refer to directions toward and away from, respectively, the geometric center of a device and designated parts thereof.

BRIEF DESCRIPTION OF THE DRAWING

FIG. 1 is a perspective view of a light tester of this invention;

FIG. 2 is frontal sectional elevation of the tester, taken along line 2—2 of FIG. 1, showing the tester in combination with a battery and a bulb and socket;

FIG. 3 is a bottom plan view of the socket, taken along line 3—3 of FIG. 2; and

FIG. 4 is a frontal elevation of an alternate embodiment of the invention.

DRAWING REFERENCE NUMERALS

A: gap formed by 26 and 28
B: distance between 8 and 10
C: diameter of 8, 10
1: light tester
4: body of 1
6: port in 4 for 44
8: left probe in 4
10: right probe in 4
12: resistor for 8
14: wire from 12 to 16
16: male battery contact on 20
18: female battery contact on 20
20: contact plate in 4
22: wire from 18 to 10
24: socket assembly for 39
26: left aperture in 24
28: right aperture in 24
30: socket contacts in 24 for 32 and 34
31: light string
32: left wire of 31
34: right wire of 31
36: bulb contacts
38: base of 39
39: light bulb
44: battery
46: female battery post
48: male battery post
101: light tester
104: body of 101
108: left probe in 104
110: right probe in 104
116: male battery contact on 120
118: female battery contact on 120
120: contact plate in 104

DESCRIPTION OF A PREFERRED EMBODIMENT

Referring to FIG. 1, there is illustrated therein a holiday light tester 1 into which has been inserted a standard size 9 V nine-volt battery 44. A parallel pair of linear and cylindrical electrically-conductive metal probes, namely left probe 8 and right probe 10, protrude upwardly from the molded plastic body 4 of the tester 1.

Turning to FIG. 2, it can be seen that the battery 44 may be operably connected to the tester 1 through insertion of the battery into a congruently-shaped port 6 which is formed in the bottom of the tester body 4 by the wall thereof. The left probe 8 enters the interior of the body and connects to a resistor 12 with preferably a 22 ohm, TM watt rating. This resistor is connected to a battery contact (in this example, a "male" battery contact 16) by means of an electrically conductive wire 14. A second battery contact 18 (for example, one of the opposite or "female" type) is attached, along with contact 16, to a more or less rigid contact mounting plate 20. The mounting plate is molded or snapped in place within the tester body 4. An electrical wire 22 connects the female battery contact 18 to the right probe 10. The female battery post 46 of the battery 44 fits around the male contact 16 of the tester 1 and the male battery post 48 fits into the tester's female contact 18. This establishes electrical connection and powers the tester.

The tester 1 is intended for use in combination with one type of common light string 31, which type is built to more or less standard specifications and dimensions. A pair of electrically conductive wires (for example, left wire 32 and right wire 34) are twisted together to form the string 31. A plurality of light bulb socket assemblies 24 are regularly spaced along the length of the holiday light string, only one of said sockets being illustrated in FIG. 2.

The socket assembly 24 is molded out of plastic. To minimize expense, it is molded and assembled with quite loose tolerances. The two wires 32 and 34 enter the interior of the socket 24 through an aligned pair of roughly circular and overlapping apertures, namely left aperture 26 and right aperture 28. These apertures may be separated from one another or they may merge to form a continuous elongated slot. In the case of a single slot, its right and left sides will function as an aligned pair of apertures and will be so considered herein. Normally, the apertures merge only slightly, as shown in the detail view of FIG. 3, so as to overlap and form a constricted throat which is narrow enough to prevent one electrical wire from entering the aperture of the other.

In any event, the diameter of each aperture 26, 28 is significantly larger than the common diameter of the wires 32, 34. The wires 32, 34 each connect to separate socket contacts 30 which are affixed to opposite sides of the hollow interior of the socket assembly 24. One light bulb 39 fits into the hollow of each socket 24, such that contact wires 36 running down the sides of the plastic base 38 of the bulb 39 touch and establish electrical contact with the socket contacts 30.

As perhaps best seen in FIG. 3, the socket wire apertures 26, 28 are significantly oversized with respect to the diameter of the wires 32, 34. Therefore, there is ample room for the probes 8, 10 to enter the interior of the socket assembly 24. Even though the socket is not constructed for this purpose, it will not readily be damaged thereby. This can be done without disconnecting the wires 32, 34, which wires are intended to be permanently attached to the electrical contacts 30. Once within the apertures 26, 28, respectively, the probes 8, 10 may be temporarily placed into electrical connection with the socket contacts 30, thereby also establishing electrical connection with the bulb contacts 36 and lighting the bulb 39—provided that the bulb is not defective. In some cases, the probes may touch and establish direct connection with the bulb contacts 36. In either event, an undamaged bulb 39 will light from the power of the battery 44 when the probes are so inserted, and a defective or burned-out bulb will not. This is a positive test which does not require that the bulb be removed from the socket 24. It is to be recalled that removing the bulb 39 is not only tedious, but the very act of doing so may damage an otherwise good bulb.

Of course, in the event of a test the result of which is at all ambiguous, the bulb 39 may be removed from its socket 24. The probes 8, 10 may then be pressed directly against the bulb's contact wires 36 for confirmation of the test results.

Although the tester will work with a variety of light strings 31, and the dimensions of the various parts of such strings may vary somewhat due to the aforementioned lack of closely established tolerances, certain dimensions of the tester should stay within more or less fixed ranges in order to assure nearly universal effectiveness and to prevent the tester from being harmful to the socket assemblies.

Turning again to FIG. 3, the length of the gap A formed by the overlapping alignment of the apertures 26, 28 may vary between 5 mm and 6 mm. In one typical socket assembly 24, it has been found to be 5.8 mm. Therefore, the length or distance B between the outside walls of the probes (i.e. the distance between the probes plus their combined widths/diameters) should vary from about 4.5 mm to 5.5 mm. Probably, distance B should be no more than 6 mm, although probes which are only slightly too widely spaced might be allowed temporarily to flex inwardly together somewhat upon insertion into the socket. One effective spacing B has been found to be 4.8 mm. Finally, the common width or diameter C of the probes 8, 10 might vary between 0.5 mm and 1.5 mm without overly crowding the socket apertures 26, 28. 1.0 mm, more or less, has been found to be one effective probe diameter C.

Referring to FIG. 4, there is illustrated therein an alternate embodiment of the invention, namely, a holiday light tester 101. A parallel pair of straight metal probes, namely left probe 108 and right probe 110, protrude upwardly from the molded plastic body 104 of the tester 101. A male battery contact 116 and a female battery contact 118 are mounted on a contact plate 120.

Insofar as the battery posts will establish firm connection between the battery posts and the contacts 116 and 118, the elongated battery port of the previous embodiment may be unnecessary. It is therefore eliminated from the tester 101 in order to reduce the size of the device. However, it is not expensive to include a port 6, as is done in tester 1, and such a port may give some added strength to the interconnection between the battery and the tester.

While the above provides a full and complete disclosure of the preferred embodiments of this invention, various modifications, alternate constructions, and equivalents may be employed without departing from the true spirit and scope of the invention. Such changes might involve alternate materials, components, structural arrangements, sizes, operational features or the like. For example, the device could readily be modified for use with AAA, AA, B, C, D, or other common household-size portable battery. Therefore, the above description and illustrations should not be construed as limiting the scope of the invention which is defined by the appended claims.

What is claimed is:

1. For testing a holiday light bulb of a standard type having a socket, the bottom of which socket forms an aligned pair of apertures or a slot, the apertures together or the slot having a first length, light tester apparatus including:
    a body;
    a pair of linear rigid probes for insertion into said apertures or slot, said probes rigidly affixed to the body so as to protrude upwardly out therefrom and spaced apart a fixed second length, which second length includes the width of each probe and which second length is equal to or less than the first length, but not substantially more than 1.5 mm less than the first length, each probe having a maximum width of between 0.5 mm and 1.5 mm; and
    means on the body for operatively connecting a battery to the probes for supplying electrical current thereto.

2. The apparatus of claim 1 wherein:
    the connecting means includes a male battery contact and a female battery contact for attaching to the female and male posts, respectively, of a size 9 V nine-volt battery.

3. The apparatus of claim 2 wherein:
    the second length is from 4.5 mm to 6.0 mm.

4. The apparatus of claim 3 wherein:
    the connecting means includes a resistor.

5. The apparatus of claim 4 wherein:
    the resistor has a resistance of between 22 and 30 ohms.

6. The apparatus of claim 5 wherein:
    the probes are cylindrical and are affixed to the body parallel to each other.

7. In combination with a light bulb string of the standard type which has a plurality of bulbs in sockets wired in series, the bottom of each socket forming an aligned pair of overlapping apertures each leading to an electrical contact inside the socket, the apertures together having a first length, light tester apparatus including:
    a body;
    a pair of linear probes affixed to the body and spaced apart a second length, which second length includes the width of each probe and the space between them and which second length is substantially equal to or less than the first length; and
    means on the body for operatively connecting a battery to the probes for supplying electrical current thereto,
        whereby the probes may be inserted into the apertures into electrical connection with the contacts.

8. The apparatus of claim 7 wherein:
    the probes are cylindrical and are affixed to the body parallel to each other.

9. The apparatus of claim 8 wherein: the connecting means includes a male and a female battery contact for attaching to the female and male posts, respectively, of a size 9 V nine-volt battery.

10. The apparatus of claim 9 wherein:

the second length is from 4.5 mm to 6.0 mm and each probe has a width of between 0.5 mm and 1.5 mm.

11. The apparatus of claim 10 wherein:
the connecting means includes a resistor having a resistance of between 22 and 30 ohms.

12. A method of testing a bulb of a holiday light bulb string of a standard type having a plurality of bulbs in sockets wired in series, the bottom of each socket forming an aligned pair of apertures or a slot leading to a pair of electrical socket contacts inside the socket, including the steps of:
providing a light tester apparatus having
a body, a pair of spaced-apart linear probes affixed to the body, and means on the body for operatively connecting a battery to the probes for supplying electrical current thereto;
operatively connecting a battery to the connecting means; and
inserting the probes into the pair of apertures or slot of one selected socket so as to form an electrical circuit between the battery and the contacts of the one selected socket,
whereby an operative light bulb engaged in electrical connection with the contacts of the one selected socket will light
and whereby an inoperative light bulb engaged in electrical connection with the contacts of the one selected socket will not light.

13. The method of claim 12 further including the step of:
first providing the light bulb string with the plurality of bulbs being affixed into the sockets so as to seal, during testing, otherwise open front ends of the sockets, one bulb being provided per socket.

14. In combination with a light bulb string of the standard type which has a plurality of bulbs affixed into a plurality of sockets so as to seal otherwise open front ends of the sockets, one bulb per socket, the sockets wired in series, each socket having a bottom forming an aligned pair of overlapping apertures or a slot, that pair of apertures or that slot leading to two separate electrical contacts inside that socket, each of those contacts being engaged in electrical connection with the bulb affixed into that socket, that pair of apertures together or that slot having a first length, light tester apparatus including:
a body;
a pair of linear probes affixed to the body so as to protrude outwardly therefrom; and
means on the body operatively connecting a battery to the probes for supplying electrical current thereto,
the probes being inserted into the pair of apertures or the slot of one selected socket through the bottom of the selected socket and being engaged in electrical connection with the contacts thereof and, thereby, in electrical connection with that bulb of the plurality of bulbs which is affixed in the selected socket.

15. The apparatus of claim 14 wherein:
the probes are spaced apart a second length, which second length includes the width of each probe and the space between them and which second length is substantially equal to or less than the first length.

* * * * *